United States Patent
Novak

(10) Patent No.: US 7,072,024 B2
(45) Date of Patent: Jul. 4, 2006

(54) LITHOGRAPHIC PROJECTION METHOD AND APPARATUS

(75) Inventor: W. Thomas Novak, Hillsborough, CA (US)

(73) Assignee: Nikon Corporation, Tokyo (JP)

(*) Notice: Subject to any disclaimer, the term of this patent is extended or adjusted under 35 U.S.C. 154(b) by 45 days.

(21) Appl. No.: 10/761,436

(22) Filed: Jan. 20, 2004

(65) Prior Publication Data

US 2005/0157280 A1 Jul. 21, 2005

(51) Int. Cl.
- G03B 27/42 (2006.01)
- G03B 27/52 (2006.01)
- G03B 27/58 (2006.01)
- G01N 21/86 (2006.01)

(52) U.S. Cl. .......................... 355/53; 355/55; 355/72; 250/548

(58) Field of Classification Search ............... 355/53, 355/72, 73, 75, 76, 40, 67; 250/548; 356/400, 356/401; 350/399, 400

See application file for complete search history.

(56) References Cited

U.S. PATENT DOCUMENTS

| | | | |
|---|---|---|---|
| 4,999,669 A | 3/1991 | Sakamoto et al. ............ 355/53 |
| 5,416,562 A | 5/1995 | Ota et al. ..................... 355/53 |
| 5,917,580 A | 6/1999 | Ebinuma et al. .............. 355/53 |
| 6,208,407 B1 | 3/2001 | Loopstra ...................... 355/53 |
| 6,400,441 B1 | 6/2002 | Nishi et al. ................... 355/53 |
| 6,590,636 B1* | 7/2003 | Nishi ............................ 355/53 |
| 6,654,100 B1* | 11/2003 | Yoda ............................ 355/53 |
| 6,674,510 B1* | 1/2004 | Jasper et al. ................. 355/55 |
| 6,788,393 B1* | 9/2004 | Inoue ........................... 355/72 |
| 2005/0237510 A1* | 10/2005 | Shibazaki ..................... 355/72 |

FOREIGN PATENT DOCUMENTS

| | | |
|---|---|---|
| EP | 0 077 878 A1 | 4/1983 |
| EP | 0687957 A1 | 12/1995 |
| EP | 0 793 073 A2 | 3/1997 |

OTHER PUBLICATIONS

Patent Abstracts of Japan, Publication No. 61-196532, *Exposure Device*, Tsukamoto Izumi, filed Feb. 26, 1985.
Patent Abstracts of Japan, Publication No. 57-183031, *Method For Wafer Exposure And Device Thereof*, Iwai Hiroshi, filed May 6, 1981.

* cited by examiner

Primary Examiner—William Perkey
Assistant Examiner—Vivian Nelson
(74) Attorney, Agent, or Firm—Beyer Weaver & Thomas LLP

(57) ABSTRACT

A lithographic projection apparatus for successively projecting a pattern on wafers by preliminarily determining locations of surface points of each wafer before it is illuminated in a projection station has a pair of measuring stations arranged oppositely with respect to the projection station at the center. Each measuring station has a wafer surface sensor for determining the locations of surface points of the wafer carried on a stage and a stage height sensor for measuring the height of a reference plane on the stage. A wafer on a stage is placed in one of the measuring stations to have measurements taken and ideal height data are collected while another wafer is being illuminated in the projection station. After these measurement and illumination processes are completed, the illuminated wafer is removed from the projection station and replaced with a new wafer to be measured and illuminated. In the meantime, the measured wafer is transported into the projection station while the stage height sensor continues to monitor the height of its reference plane by using a measuring beam. Once inside the projection station, the collected ideal height data are used to control the wafer during exposure.

10 Claims, 4 Drawing Sheets

LITHOGRAPHIC PROJECTION METHOD AND APPARATUS

BACKGROUND OF THE INVENTION

This invention relates to a method of and an apparatus for lithographic projection of a mask pattern on a plurality of fields of a wafer by measuring the height of the wafer surface prior to exposure.

U.S. Pat. No. 6,208,407 has described such a system having a projection station and a measuring station. While a first wafer on a first stage is undergoing an exposure process in the projection station, a first height sensor maps the surface of a second wafer on a second stage in the measuring station, and a second height sensor measures the height of the second stage. After the exposure process is completed, the first stage is removed from the projection station, the exposed first wafer is removed from the first stage and the first stage is provided with a new wafer and then moved to the measuring station. In the meantime, the second stage and the second wafer are removed from the measuring station and placed in the projection station. The projection station is provided with a third height sensor. The second stage, after brought into the projection station, has its height measured by the third height sensor to ascertain whether it is at the ideal height for the exposure. In other words, three height sensors are involved per exposure of a wafer, and this will compound the errors leading to a loss of precision. In order to properly initialize this sensor, still another sensor may be required. Any error in such an additional sensor will add to the initialization error of the third sensor, causing further degradation of precision.

SUMMARY OF THE INVENTION

According to this invention, there is not one but a pair of measuring stations arranged in plane symmetry with respect to a projection station at the center. The projection station is of a known type for projecting a pattern given by a reticle onto a wafer, which is carried on a wafer stage but is characterized as not requiring a height sensor except possibly for calibration. Each of a pair of measuring stations is for determining the surface profile of a wafer by mapping, or measuring the height at various locations on the surface, as well as the height of the stage, or that of a reference plane on the stage. For this purpose, each measuring station comprises a wafer height sensor of a known kind and a stage height sensor adapted to measure the height of a reference plane preliminarily formed on the stage. The stage height sensor may preferably be an interferometer and emits a measuring beam horizontally in a direction toward the projection station so as to have this emitted beam reflected vertically upward by the appropriately sloped (by 45°) reference plane on the stage and have it reflected back downward by a horizontal reference mirror placed above. The reflected downward beam is reflected again by the reference plane and is received by the stage height sensor such that the height of the reference plane can be measured. Data thus obtained by the wafer height sensor and the stage height sensor may be stored and are used by a control unit to determine the so-called ideal height at which the surface of the wafer is to be placed when it is illuminated in the projection station in a well-known manner.

Such an apparatus is operated according to a method of this invention by using one of the measuring stations to map the surface of a wafer on a stage and also to measure the height of the reference plane of the stage carrying this wafer while another wafer on another stage is being illuminated in the projection station. When these processes are completed, the illuminated wafer is removed together with its stage from the projection station, and a new wafer to be processed is placed on the stage so as to be brought to the other measuring station on the opposite side of the projection station. In the meantime, the measured wafer is transported together with its stage into the projection station, but this is done along the optical path of the measuring light beam emitted from the stage height sensor such that the height of the reference plane of this stage is measured continuously until the stage reaches and is set in the projection station, ready to have its wafer illuminated. This is instead of using an extra height sensor to check the height of the reference plane of the stage.

These steps are repeated, surface profiles of wafers being determined alternately in the pair of measuring stations arranged opposite each other such that each wafer stage can be transported from either of the measuring stations into the projection station while the height of its reference plane is continuously monitored by associated one of the stage height sensors.

BRIEF DESCRIPTION OF THE DRAWING

The invention, together with further objects and advantages thereof, may best be understood with reference to the following description taken in conjunction with the accompanying drawings in which.

DETAILED DESCRIPTION OF SPECIFIC EMBODIMENTS

Figure 4:
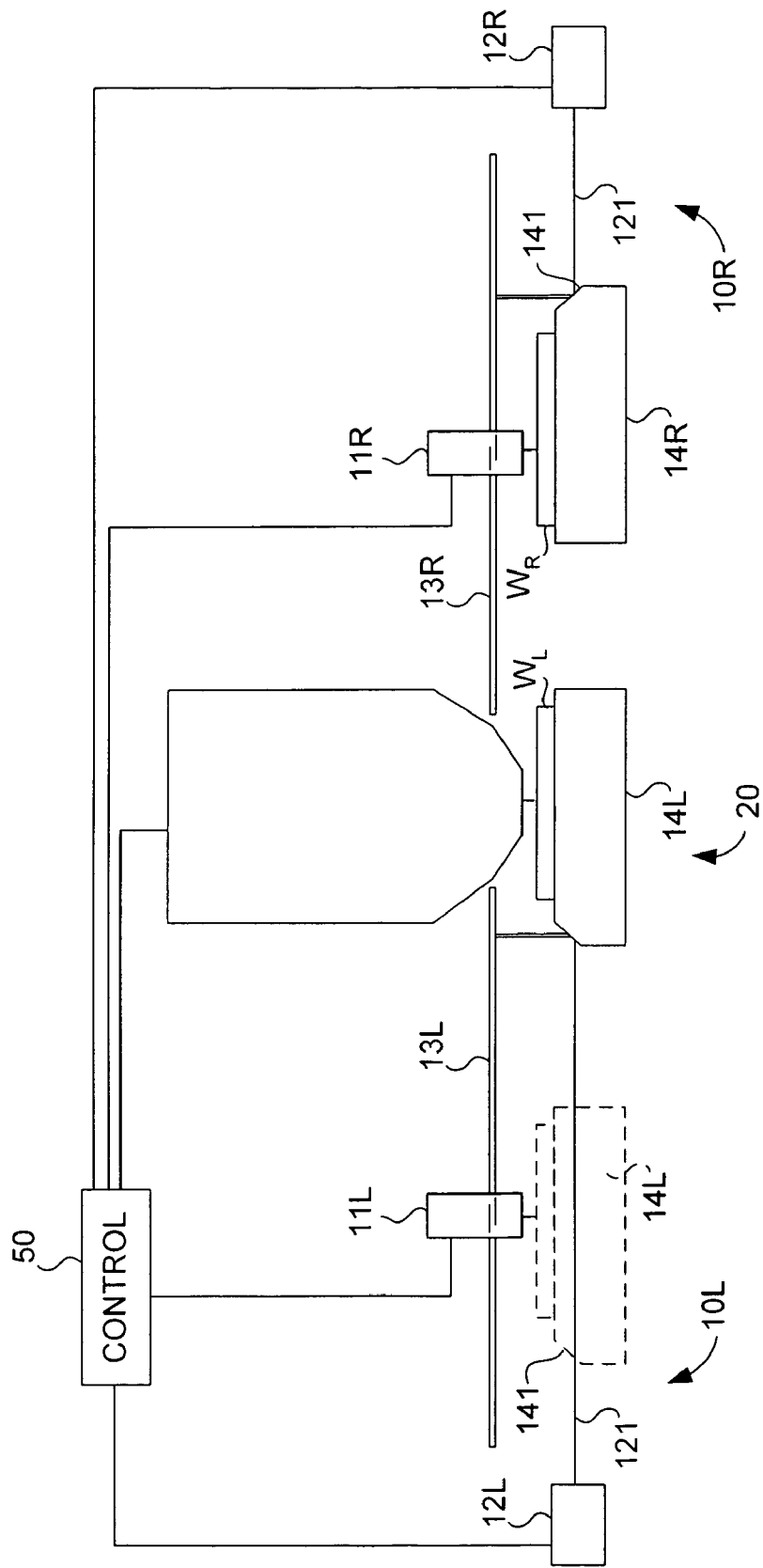
FIG. 4 is a schematic drawing for showing a projection method and apparatus embodying this invention.

FIG. 4 shows schematically a lithographic projection apparatus embodying this invention. Since this invention is an improvement over a prior art apparatus described in aforementioned U.S. Pat. No. 6,208,407 and there are many aspects that are similar, U.S. Pat. No. 6,208,407 is herein incorporated by reference.

As shown in FIG. 4, a lithographic projection apparatus embodying this invention is characteristically different from the apparatus shown in U.S. Pat. No. 6,208,407 in that there is provided a pair of left-hand and right-hand side measuring stations 10L and 10R set up in plane symmetry with respect to a projection station 20 at the center. The projection station 20 is for projecting a pattern, as will be explained more in detail below with reference to a lithographic exposure apparatus. The left-hand side measuring station 10L is provided with a wafer height sensor 11L, a stage height sensor 12L, a horizontal mirror 13L and a wafer stage 14L which is shown with a wafer $W_L$ placed thereon. Similarly, the right-hand side measuring station 10R is provided with a wafer height sensor 11R, a stage height sensor 12R, a horizontal mirror 13R and a wafer stage 14R which is shown with a wafer $W_R$ placed thereon. The wafer height sensors are 11L and 11R are adapted to measure the heights of the surface areas of the wafers $W_L$ and $W_R$ carried on the stages 14L and 14R, respectively. The stage height sensors 12L and 12R are disposed away from the projection station 20 and each adapted to transmit a measuring beam 121 horizontally towards the projection station 20, to be reflected by a reference plane 141 of the respective wafer stage (14L, 14R) into a vertically upward direction. The upwardly reflected beams are reflected back downward by the horizontally disposed mirrors 13L and 13R and returned to the stage height sensors 12L and 12R such that the heights of the reference planes 141 of the stages 14L and 14R can be determined. Means for transporting the stages 14L and 14R between the corresponding one of the measuring stations 10L and 10R and the projection station 20 are not shown.

In the method according to the invention, FIG. 4 shows a moment when the right-hand side wafer $W_R$ is in the right-hand side measuring station 10R to have the height of a point on its surface measured (or mapped to have its surface profile determined) and the left-hand side wafer $W_L$ is in the projection station 20 to be illuminated by a pattern-forming beam incident vertically (in the "incidence direction") to have a pattern projected thereon. Data related to the obtained surface profile of the wafer $W_R$ may be referred to as the ideal height data and are stored. In FIG. 4, numeral 50 indicates a control unit for generally controlling the operations of the apparatus, serving also to store the ideal height data. After this illumination and height measurements have been performed, the left-hand side stage 14L is removed from the projection station 20, has the patterned wafer $W_L$ removed therefrom and replaced with a new wafer and is placed with this new wafer in the left-hand side measuring station 12L, as shown by dotted lines in FIG. 4, to have the newly placed wafer mapped to determine its surface profile. In the meantime, the measured right-hand side wafer $W_R$ is transported into the projection station 20 to be likewise illuminated and to have the pattern projected thereon by using the ideal height data just obtained and stored in the control unit 50. During this transportation process, the left-hand side stage 14L is not in its path and hence the right-hand side stage 14R is moved straight with its reference plane 141 maintained in the optical axis of the measuring beam 121 from the right-hand side stage height sensor 12R such that the measurement of its height continues to be taken until the stage 14R is inside the projection station 20. Since the measurement of the height of the stage 14R is not interrupted, as was the case with the system according to aforementioned U.S. Pat. No. 6,208,407, the projection station 20 need not be provided with any extra stage height sensor.

Figure 1:
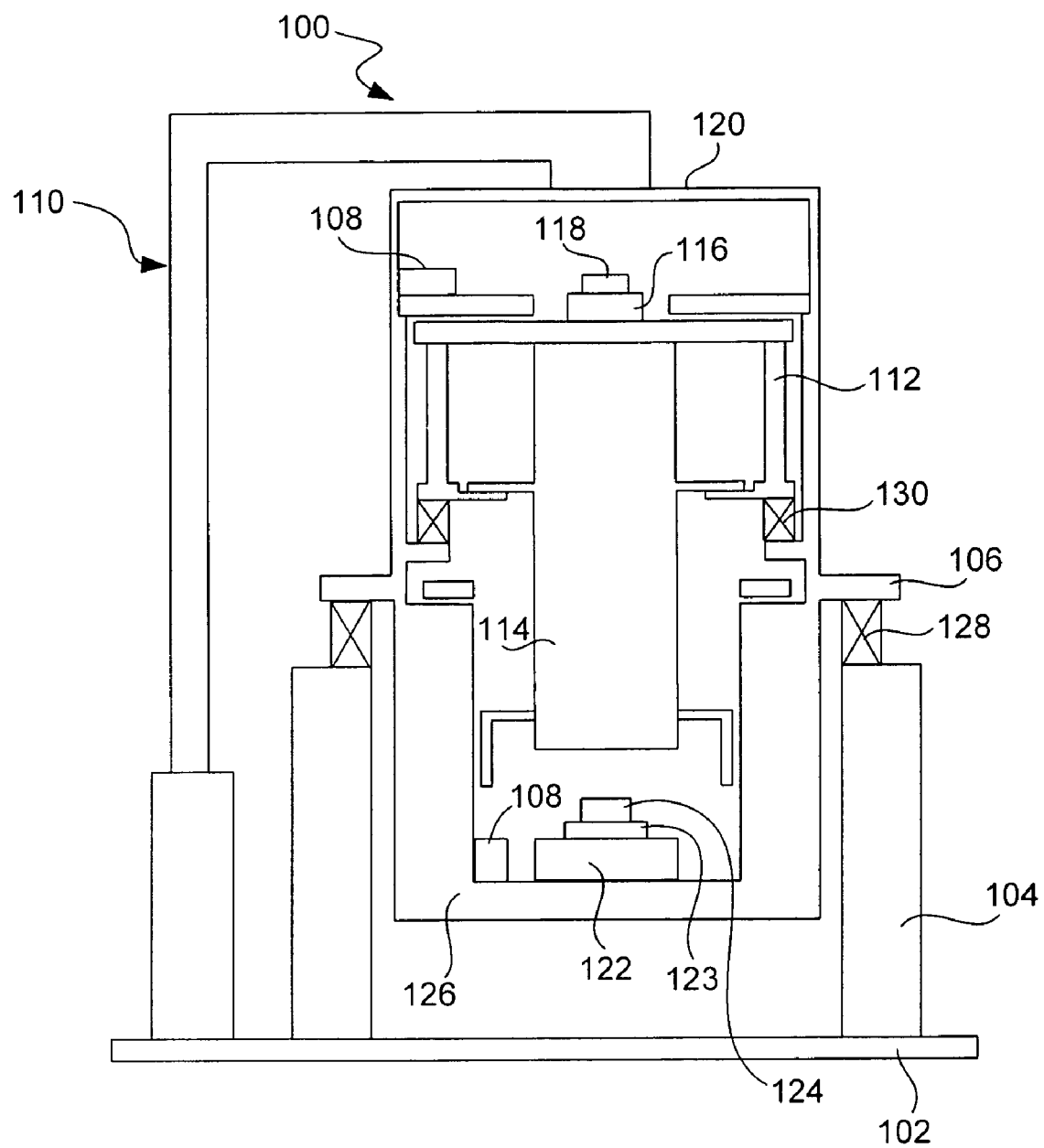
FIG. 1 is a cross-sectional schematic view of a lithographic exposure apparatus incorporating a projection apparatus of this invention.

FIG. 1 shows a typical lithographic exposure apparatus 100 incorporating a projection apparatus of this invention, comprising a mounting base 102, a support frame 104, a base frame 106, a measurement system 108, a control system (not shown), an illumination system 110, an optical frame 112, an optical device 114, a reticle stage 116 for retaining a reticle 118, an upper enclosure 120 surrounding the reticle stage 116, a wafer stage 122, a wafer table 123 for retaining a semiconductor wafer workpiece 124, and a lower enclosure 126 surrounding the wafer stage 122.

The support frame 104 typically supports the base frame 106 above the mounting base 102 through a base vibration isolation system 128. The base frame 106 in turn supports, through an optical vibration isolation system 130, the optical frame 112, the measurement system 108, the reticle stage 116, the upper enclosure 120, the optical device 114, the wafer stage 122, the wafer table 123 and the lower enclosure 126 above the base frame 106. The optical frame 112 in turn supports the optical device 114 and the reticle stage 116 above the base frame 106 through the optical vibration isolation system 130. As a result, the optical frame 112, the components supported thereby and the base frame 106 are effectively attached in series through the base vibration isolation system 128 and the optical vibration isolation system 130 to the mounting base 102. The vibration isolation systems 128 and 130 are designed to damp and isolate vibrations between components of the exposure apparatus 100 and comprise a vibration damping device. The measurement system 108 monitors the positions of the stages 116 and 122 relative to a reference such as the optical device 114 and outputs position data to the control system. The optical device 114 typically includes a lens assembly that projects and/or focuses the light or beam from the illumination system 110 that passes through the reticle 118. The reticle stage 116 is attached to one or more movers (not shown) directed by the control system to precisely position the reticle 118 relative to the optical device 114. Similarly, the wafer stage 122 includes one or more movers (not shown) to precisely position the wafer workpiece 124 with the wafer table 123 relative to the optical device (lens assembly) 114.

As will be appreciated by those skilled in the art, there are a number of different types of photolithographic devices. For example, exposure apparatus 100 can be used as a scanning type photolithography system which exposes the pattern from reticle 118 onto wafer 124 with reticle 118 and wafer 124 moving synchronously. In a scanning type lithographic device, reticle 118 is moved perpendicular to an optical axis of optical device 114 by reticle stage 116 and wafer 124 is moved perpendicular to an optical axis of optical device 114 by wafer stage 122. Scanning of reticle 118 and wafer 124 occurs while reticle 118 and wafer 124 are moving synchronously.

Alternatively, exposure apparatus 100 can be a step-and-repeat type photolithography system that exposes reticle 118 while reticle 118 and wafer 124 are stationary. In the step and repeat process, wafer 124 is in a constant position relative to reticle 118 and optical device 114 during the exposure of an individual field. Subsequently, between consecutive exposure steps, wafer 124 is consecutively moved by wafer stage 122 perpendicular to the optical axis of optical device 114 so that the next field of semiconductor wafer 124 is brought into position relative to optical device 114 and reticle 118 for exposure. Following this process, the images on reticle 118 are sequentially exposed onto the fields of wafer 124 so that the next field of semiconductor wafer 124 is brought into position relative to optical device 114 and reticle 118.

However, the use of exposure apparatus 100 provided herein is not limited to a photolithography system for a semiconductor manufacturing. Exposure apparatus 100, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly.

The illumination source (of illumination system 110) can be g-line (436 nm), i-line (365 nm), KrF excimer laser (248 nm), ArF excimer laser (193 nm) and $F_2$ laser (157 nm). Alternatively, the illumination source can also use charged particle beams such as x-ray and electron beam. For instance, in the case where an electron beam is used, thermionic emission type lanthanum hexaboride (LaB$_6$,) or tantalum (Ta) can be used as an electron gun. Furthermore, in the case where an electron beam is used, the structure could be such that either a mask is used or a pattern can be directly formed on a substrate without the use of a mask.

With respect to optical device 114, when far ultra-violet rays such as the excimer laser is used, glass materials such as quartz and fluorite that transmit far ultra-violet rays is preferably used. When the F$_2$ type laser or x-ray is used, optical device 114 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 2:
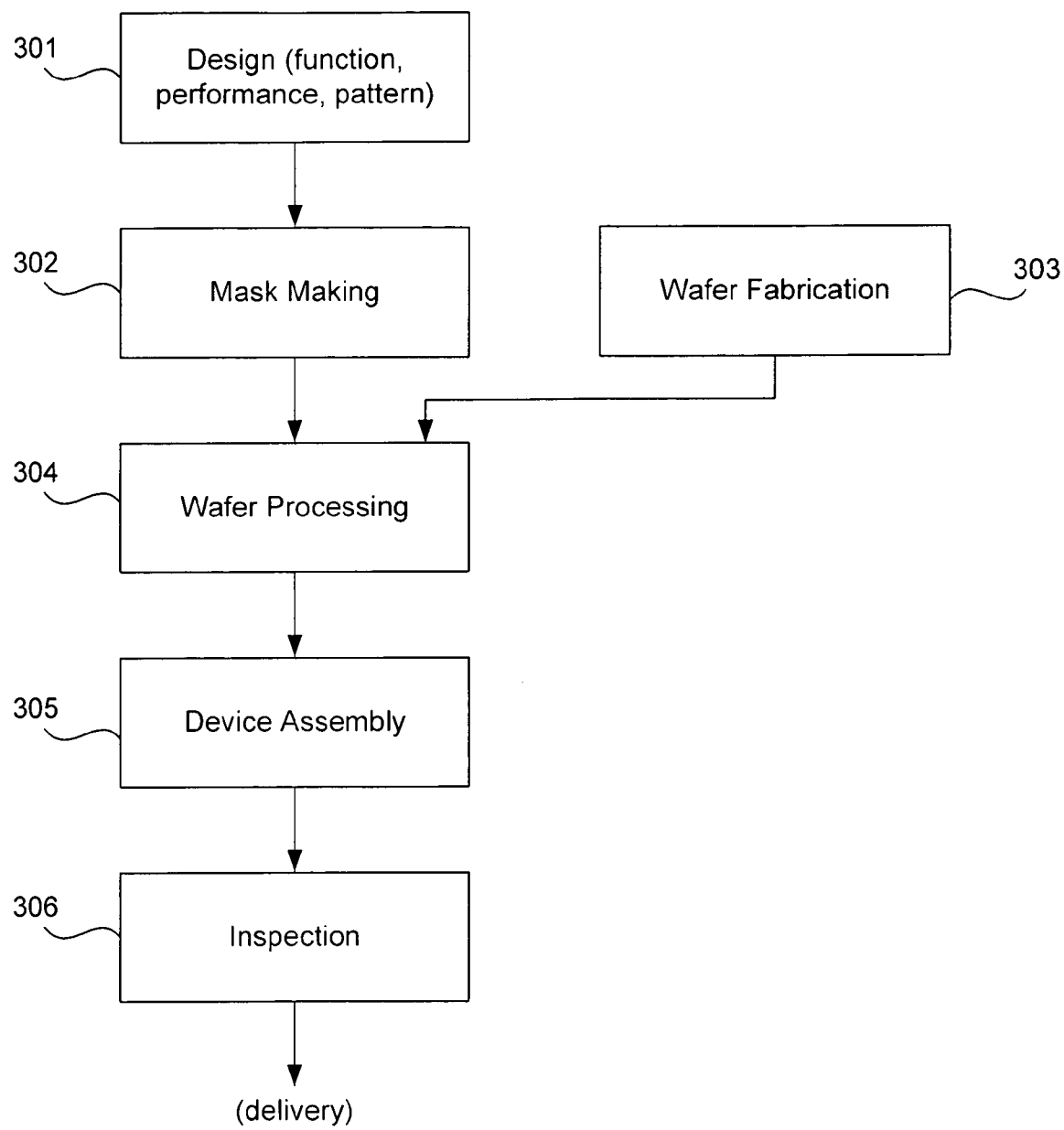
FIG. 2 is a process flow diagram illustrating an exemplary process by which semiconductor devices are fabricated by using the apparatus shown in FIG. 1 according to the present invention.

Further, semiconductor devices can be fabricated using the above described systems, by the process shown generally in FIG. 2. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system such as the systems described above. In step 305 the semiconductor device is assembled (including the dicing process, bonding process and packaging process), then finally the device is inspected in step 306.

Figure 3:
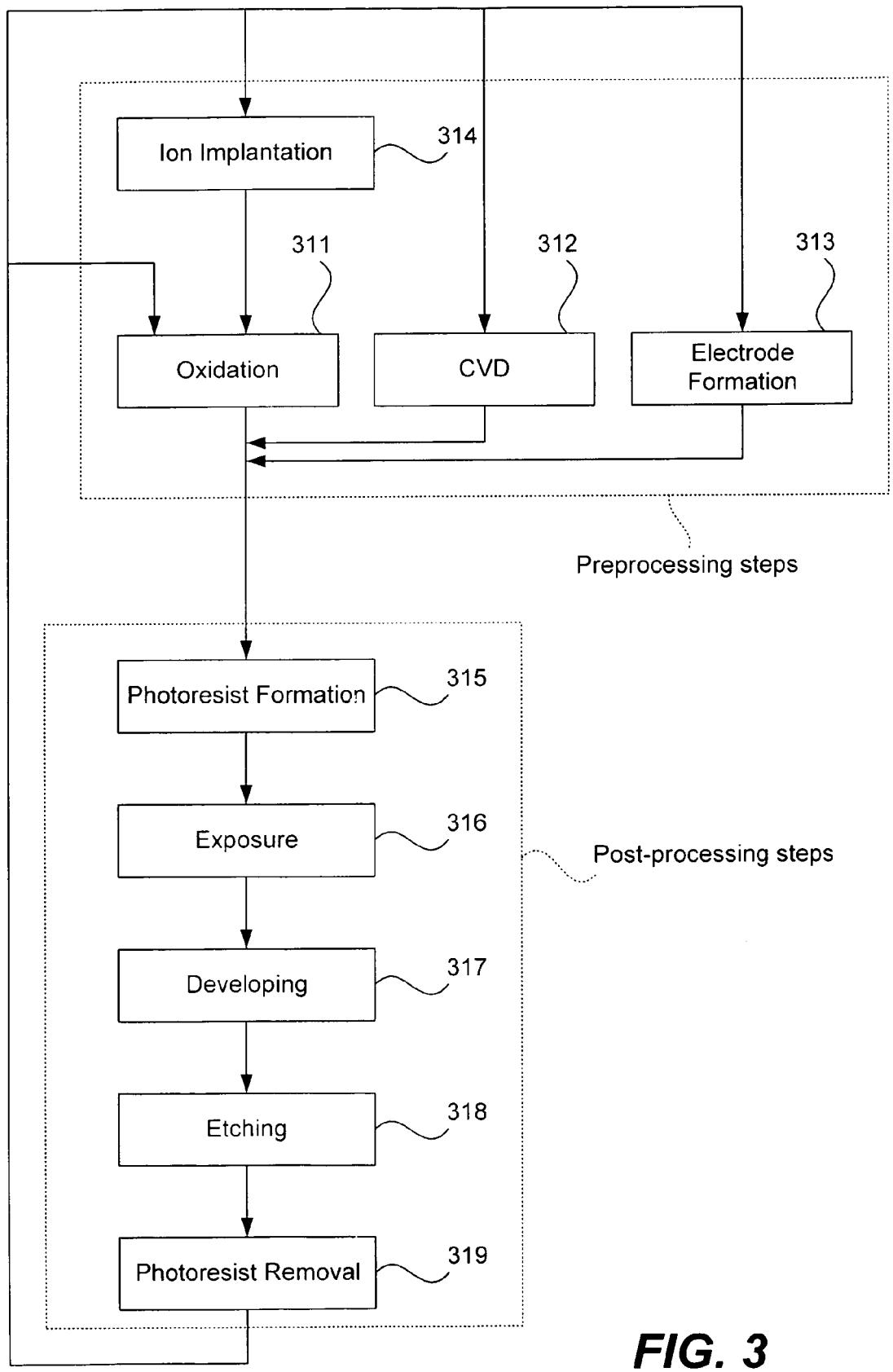
FIG. 3 is a flowchart of the wafer processing step shown in FIG. 2 in the case of fabricating semiconductor devices according to the present invention.

FIG. 3 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

Although the invention was described above with reference to only one example, this example is not intended to limit the scope of the invention. Many variations and modifications are possible within the scope of the invention. For example, the measuring beam from stage height sensors need not be laser light. Such modifications and variations that may be apparent to a person skilled in the art are intended to be included within the scope of the invention.

What is claimed is:

1. A lithographic projection apparatus that projects a pattern on a wafer by a projection beam by preliminarily determining locations of surface points of a surface profile of the wafer on a stage and subsequently introducing the stage with the wafer into the projection beam; said apparatus comprising:
    a projection station that projects a pattern on the wafer arranged on the stage by the projection beam incident in an incidence direction; and
    a first measuring station and a second measuring station that are arranged oppositely with respect to said projection station and each serve to measure a height of a wafer and a height of a reference plane of the stage, said first measuring station including a first wafer height sensor and a first stage height sensor, said second measuring station including a second wafer height sensor and a second stage height sensor, said first wafer height sensor and said second wafer height sensor each serving to measure the height of a wafer in said incidence direction, said first stage height sensor and said second stage height sensor emitting light generally towards said projection station and thereby measuring the height of the stage.

2. The lithographic projection apparatus of claim 1 further comprising a control unit that controls said projection station according to the height of the wafer and the height of the stage measured in said first measuring station and said second measuring station.

3. The lithographic projection apparatus of claim 1 further comprising a transporter that transports the stage with the wafer placed thereon perpendicularly to said incidence direction between said first measuring station and said projection station and between said second measuring station and said projection station.

4. A lithographic projection method comprising the steps of:
    providing a projection station with apparatus for projecting a pattern on a wafer arranged on a stage by a projection beam incident in an incidence direction and a pair of measuring stations consisting of a first measuring station and a second measuring station, said first measuring station including a first wafer height sensor and a first stage height sensor, said second measuring station including a second wafer height sensor;
    introducing into said first measuring station a first stage carrying a first wafer thereon, measuring a height of said first wafer in said incidence direction with said first wafer height sensor, and measuring a height of a reference plane of said first stage with said first stage height sensor by emitting light in a direction perpendicular to said incidence direction toward said reference plane of said first stage and also toward said projection station;
    thereafter transporting said first stage with said first wafer thereon into said projection station while continuously measuring the height of the reference plane of said first stage with said first stage height sensor, and projecting said pattern on said first wafer arranged on said first stage by said projection beam incident in said incidence direction;
    introducing into said second measuring station a second stage carrying a second wafer thereon, measuring a height of said second wafer in said incidence direction with said second wafer height sensor, and measuring a height of a reference plane of said second stage with said second stage height sensor by emitting light in a direction perpendicular to said incidence direction toward said reference plane of said second stage and also toward said projection station; and
    thereafter transporting said first stage with said first wafer thereon out of said projection station, transporting said second stage with said second wafer thereon into said projection station while continuously measuring the height of the reference plane of said second stage with said second stage height sensor, and projecting said pattern on said second wafer arranged on said second stage by said projection beam incident in said incidence direction.

5. A lithography system that projects a pattern on a wafer by a projection beam by preliminarily determining locations of surface points of the wafer on a stage and subsequently introducing the stage with the wafer into the projection beam, said lithographic system comprising:
    an illumination source;
    an optical system;
    a reticle stage arranged to retain a reticle; and
    a working stage including a projection station that projects a pattern from said reticle on the wafer arranged on the stage by the projection beam incident in an incidence direction, and a first measuring station and a second measuring station that are arranged oppositely with respect to said projection station and each serve to measure a height of a wafer and a height of a reference plane of the stage, said first measuring station including a first wafer height sensor and a first stage height sensor, said second measuring station including a second wafer height sensor and a second stage height sensor, said first wafer height sensor and said second wafer height sensor each serving to measure the height of a wafer in said incidence direction, said first stage height sensor and said second stage height sensor emitting light generally towards said projection station and thereby measuring the height of the stage.

6. The lithography system of claim 5 further comprising an enclosure that surrounds at least a portion of the working stage, the enclosure having a sealing surface.

7. An object manufactured with the lithography system of claim 5.

8. A wafer on which an image has been formed by the lithography system of claim 5.

9. A method for making an object using a lithography process, wherein the lithography process utilizes a lithography system as recited in claim 5.

10. A method for patterning a wafer using a lithography process, wherein the lithography process utilizes a lithography system as recited in claim 5.

* * * * *